United States Patent [19]

DuBrul

[11] 4,025,917

[45] May 24, 1977

[54] SIMPLIFIED TIME CODE READER WITH DIGITAL PDM DECODER

[75] Inventor: James M. DuBrul, Bowie, Md.

[73] Assignee: The United States of America as represented by the Secretary of the Navy, Washington, D.C.

[22] Filed: Nov. 6, 1975

[21] Appl. No.: 629,732

[52] U.S. Cl. .......................... 340/347 DD; 329/104

[51] Int. Cl.$^2$ .......................................... H03K 13/00

[58] Field of Search ...................... 178/66, 68, 113; 329/104–110; 360/40; 340/167 R, 167 A, 167 B, 167 P, 168 R, 203, 168 B, 168 CC, 204, 205, 347 DD; 328/111, 112; 307/234, 231; 235/92 T; 179/15 AW

[56] References Cited

UNITED STATES PATENTS

| | | | |
|---|---|---|---|
| 2,870,429 | 6/1959 | Hales | 340/167 A |
| 3,080,547 | 3/1963 | Cooper | 340/168 R |
| 3,218,618 | 11/1965 | Warren | 360/40 |
| 3,369,181 | 2/1968 | Braymer | 178/88 |
| 3,732,364 | 5/1973 | Terada | 360/40 |
| 3,786,360 | 1/1974 | Kawa | 329/104 |
| 3,823,397 | 7/1974 | Howard | 340/347 DD |
| 3,828,263 | 8/1974 | Blomenkamp | 328/111 |

*Primary Examiner*—Charles D. Miller

[57] ABSTRACT

The present invention receives time of day information from a time code generator which employs Pulse Duration Modulation (PDM) code and decodes it in a manner that is frequency independent and time-lag compensated. According to the present time-code reader, the time-coded input is decoded into peaks (amplitude modulated cycles) carried on a normal sine wave. The number of these cyclical peaks are proportional to the duration of the D. C. pulse of the PDM code and can be counted to determine whether a binary 1 or 0 has been transmitted. Because a peak may be lost or missed due to distortion, the invention reads four to six peaks as a 1 and less than four peaks as a 0. The serially received 1's and 0's are transmitted through a network which takes approximately one second to pass data from input to output display. To compensate for this time lag, one second is added on to the output reading to make it contemporaneous with the input signal. The final output is a display of seconds, minutes, hours, days, and control functions.

16 Claims, 6 Drawing Figures

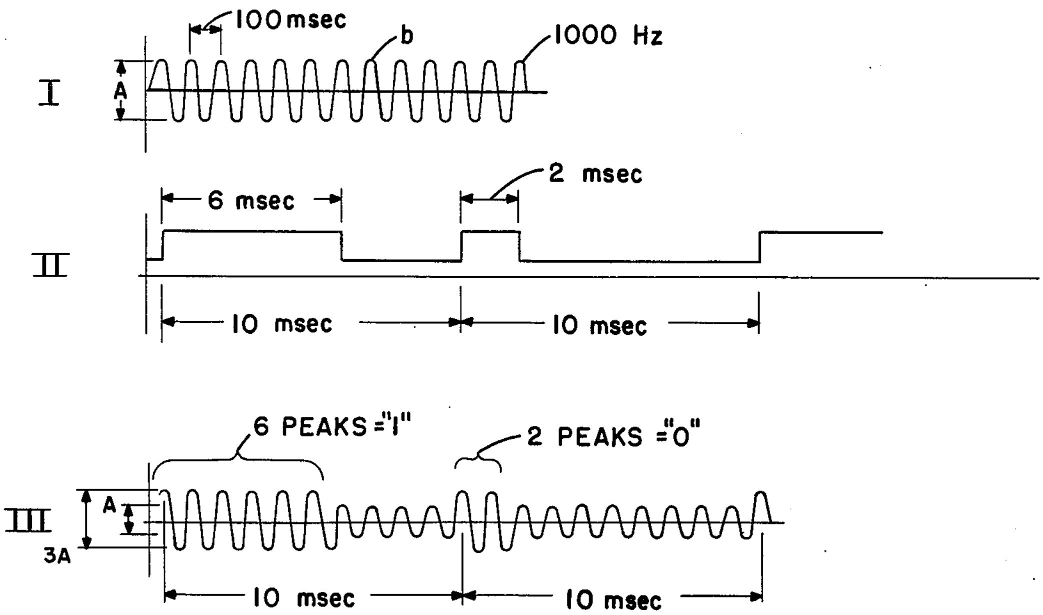
FIG. 2
| | BCD 8421 (LSB) | INVERTED BCD 8421 | DECODER OUTPUT | |
|---|---|---|---|---|
| 0 | 0000 | 1111 | 15 | |
| 1 | 0001 | 1110 | 14 | |
| 2 | 0010 → | 1101 | 13 | |
| 3 | 0011 | 1100 | 12 | |
| 4 | 0100 | 1011 | 11 | |
| 5 | 0101 | 1010 | 10 | |
| 6 | 0110 | 1001 | 9 → | OUTPUT AS MODULO-6 (6 INVERTED) |
| 7 | 0111 | 1000 | 8 | |
| 8 | 1000 | 0111 | 7 | |
| 9 | 1001 | 0110 | 6 | |
| 10 | 1010 | 0100 | 5 → | OUTPUT AS MODULO-10 (10 INVERTED) |
FIG. 3
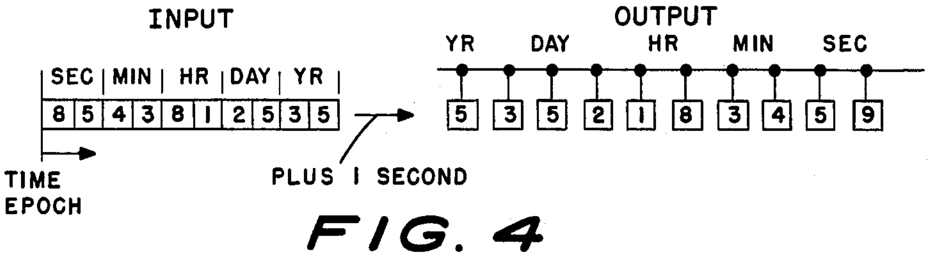
FIG. 4

| IC | | FUNCTION |
|---|---|---|
| TYPE | LOCATION | |
| SN7400 | D | QUAD-NAND |
| SN7402 | I | QUAD-NOR |
| SN74L04 | E | HEX INVERTER |
| SN7442 | H | DECODER BCD-DECIMAL |
| SN7476 | J | DUAL J-K FLIP-FLOP |
| SN7486 | F | QUAD EXCLUSIVE OR |
| SN74163 | C | 4 BIT COUNTER SYNCHRONOUS |
| SN74164 | G,L,M,N,O,P | 8 BIT SERIAL SHIFT REGISTER PARALLEL OUT |
| SN74279 | K | QUAD $\bar{S}$-$\bar{R}$ LATCHES |
| SN7493 | A,B | RIPPLE THRU COUNTER |
| 5083-7340 | | INDICATOR |
| H.P. | | HEXADECIMAL |
| 5083-7300 | | INDICATOR |
| H.P. | | 0-9 |

FIG. 6

SIMPLIFIED TIME CODE READER WITH DIGITAL PDM DECODER

BACKGROUND OF THE INVENTION

Several time codes have been established to provide time of day in serial format. One common code, the NASA 36 Bit Time Code, includes hours, minutes and seconds as well as day of the year, and a station identification. This code is transmitted by amplitude modulation of a 1000 hertz sine wave. The time code sequence repeats each second, using a pulse duration code. Binary 1's are pulses 6 milliseconds in length, binary 0's are pulses 2 milliseconds in length. These bits are shown as modulations three times the amplitude of the normal 1000 hertz sine wave.

In using this type time code, several problems have become evident. When the code is recorded on analog magnetic tape, some distortion of the AM envelope is experienced. This occasionally results in the improper decoding of the data bit. Allowing a margin of error can minimize this problem. Second, in the serial decoding of the time, the BCD time of day refers to the time epoch at the beginning of the 1 second frame. If display is made after decoding, the displayed number is 1 second behind. This can be corrected by adding 1 second to the received time code input. Third, the frame identification mark of NASA-36 bit code is a series of binary 1's. This series can occur in the station code location as well as the frame mark location. Expanding the frame mark definition to include a following zero puts the decoder 1 bit late, but removes the ambiguity.

The simplified time reader proposed in accordance with the present invention is intended to be simple, flexible and inexpensive. Parts used are all commercially available. Optional displays not required can simply be omitted. The basic consideration is simplicity, correction of the one second lag, availability of decoded day and station code, input variations of voltage (dB volts above and below 1 volt RMS) and capability of operation from one eighth to sixteen times normal code speed.

Prior art decoders have been more complex and expensive and dependent on frequency. Most time code readers simply demodulated the carrier-plus-pulse signal of the time code into its component parts, thereby retrieving the original pulse. The present invention operates normally at 1 KHz input frequency but operates as well between 125 Hz and 16 KHz. Where events are happening very quickly or very slowly, the reference time can be altered by varying the operating frequency; the information can be recorded and played back at a desired speed. One major reason for this flexibility is that the input part of the system is constructed, to a large extent, of passive elements (capacitors, resistors, etc.) with a minimal number of frequency-dependent, active elements (transistors, etc.).

BRIEF DESCRIPTION OF THE DRAWINGS

FIG. 2 is a waveform representation which illustrates, in I and II, the carrier and modulator component waveforms, respectively which together form waveform III, the input to the present invention.

FIG. 3 is a table showing the data modifications performed by the invention.

FIG. 4 is an input/output illustration which shows the output display with time lag compensated.

FIG. 6 is a tabular representation of the circuitry of FIG. 5, indicating the location of each commercially available element and its function.

DESCRIPTION OF PREFERRED EMBODIMENT

Referring to FIG. 2, the input 2 from the time code source (see FIG. 1) can be examined. The modulated carrier of waveform III, composed of carrier wave I of amplitude A and modulating signal II, is the input 2 to the present invention. The frequency of the preferred embodiment is shown to be 1 KHz. From FIG. 2 it can be seen that an amplitude modulation envelope of amplitude 3XA, hereafter referred to as "peaks", occurs every 10 milliseconds. Ideally, there are six peaks or two peaks, representing binary 1 or binary 0, respectively (see waveform III).

Figure 1:
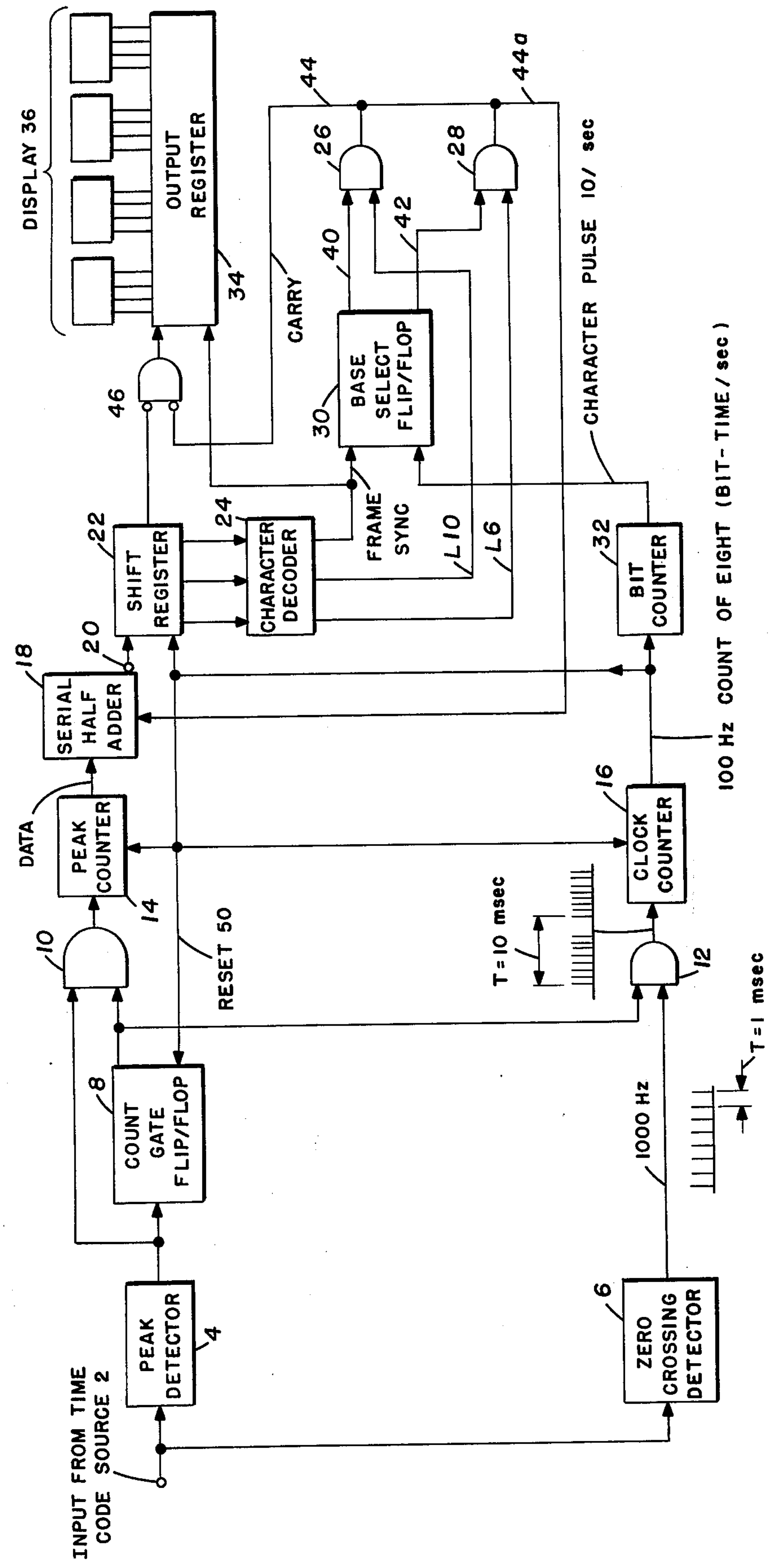
FIG. 1 is a block diagram of one embodiment of the present simplified time code reader with digital PDM decoder.

Referring now to FIG. 1, the input 2 is transmitted into peak detector 4 and zero crossing detector 6. The zero crossing detector 6 clocks a pulse corresponding to each leading edge that crosses the zero signal amplitude line. These clocked pulses occur periodically at 1 KHz, the frequency of the input signal. Peak detector 4 transmits a pulse whenever a peak, i.e., a cycle of modulated amplitude, is detected. The pulse representing the first peak in the 10 millisecond period aforementioned turns on a count gate flip-flop 8. The count gate flip-flop 8 turns ON from an original reset position with the sensing of the first peak and remains open for eight cycles, or 8 milliseconds, in the preferred embodiment, after which it automatically turns off (and is later reset by reset 50). The count gate flip-flop 8 feeds input to a first AND gate 10 which also has as an input the peaks from peak detector 4. Count gate flip-flop 8 also feeds input to a second AND gate 12 which also has as an input the pulses clocked by the zero crossing detector 6. The output from first AND gate 10 then transmits the peaks detected while the count gate flip-flop 8 is ON into peak counter 14. The output from the second AND gate 12 passes eight pulses periodically at 100 Hz (as sketched in FIG. 1) into clock counter 16. No information is transmitted during the ninth and tenth (1 msec) cycles of the ten msec period in any case. The count gate flip-flop 8 and second AND gate 12 divide the 1 KHz signal from the zero crossing detector 6 into distinct 8-count blocks which form a bit-time. The output from the clock counter 16 may be considered as a signal transmitting bit-times at 100 Hz. The count gate flip-flop 8 causes erroneous peaks during the ninth and tenth cycles which might result from distortion or the like to be not counted; only eight peaks maximum can be counted.

Also, if there is an erroneous loss or addition of a peak to the counter, the correct output binary will be read. The present invention has peak counter 14 interpret the peak count in the following way when the clock count reaches 8. If four to eight peaks are detected the count is interpreted as binary 1. If less than four peaks are detected, the count is interpreted as binary 0. This error limit need not be four, three or five could also be used. In this way, the correct binary is generated.

The data emanating from peak counter 14 is in usable binary form, except that a time lag of 1 second is inherent in the system due to the method of transmission and receipt of the data. The epoch time when transmission begins is 1 second earlier than display time. Thus, an input sent at 58 seconds will be displayed as 58 seconds 1 second later when the real time is 59 seconds. To compensate for this time-lag, the invention includes serial half-adder 18 which adds 1 (second) to the number derived from the peak count. The serial half-adder 18 acts in the normal fashion, sampling the first least significant bit (LSB) of the units of seconds data and either (a) makes it 1 if it is 0 and stops or (b) makes it 0 if it is 1, samples the second LSB, . . . and so on until the bit sampled is 0, at which point the bit is made 1 and the "adding" stops. In this way, the binary output from the serial half-adder 18 updates the data to be displayed by one second, thereby matching the output displayed to the input transmitted. The serial half-adder 18 increments one BCD character or four bits at a time. The serial half-adder 18 stops adding after the fourth bit is processed. If a carry is generated, however, (on carry input line 44*a*) serial half-adder 18 is reset and adds one to the next BCD character as it enters serial half-adder 18 and so on.

The output from the serial half-adder 18 is inverted by inverter 20 and transmitted into shift register 22. The contents of the shift register 22 takes on values which are the inverse of the actual values of the data. FIG. 3 shows, in table form, how the data coming from the peak counter 14 is modified by serial half-adder 18 then inverter 20 and finally transferred to shift register 22. By way of example, using the present embodiment, if the peak counter 14 counts five peaks (for the LSB), then four peaks, then three peaks, and finally one peak, the output from the peak counter 14 will read (starting at left with the LSB): 1100. The 4 bits, which make up a character in binary coded decimal (BCD), enter serial half-adder 18. The serial half-adder 18 examines the LSB, sees that it is a 1 and makes it a 0; it then looks at the second LSB, sees that it is 1 and makes it a 0, it then looks at the third LSB, sees that it is 0, makes it 1 and leaves the remaining bit unchanged. The serial half-adder 18 thus outputs a 0010. The inverter 20 makes this 1101. This data string enters shift register 22. Shift register 22 loads the bits it is holding into character decoder 24. The character decoder 24 reads the inverted characters to determine if the character represents the number 6, referred to as M6, or number 10, M10. It should be noted here that the character which normally represents 6 in binary is 0110; however, because the character is inverted the binary corresponding to M6 will be 1001. The inverted binary for M10 is 0101. The purpose for the inversion is to simplify the later stages of carry generation and shift enabling which are more adaptable to a 6 through 15 count (0 through 9 in inverted binary) than a 0 through 9 count.

If the character decoder 24 senses 0110 (which represents M6) or 0101 (which represents M10), the respective line L6 or L10 will be energized (turned ON). In essence, the character decoder 24 decodes BCD numbers into corresponding decimal numbers where only those BCD numbers representing six (M6) and 10 (M10) provide outputs to later stages. L6 serves as one input to AND gate 26; L10 serves as an input to AND gate 28. Both AND gates 26 and 28 receive second inputs from a base select flip-flop 30. The base select flip-flop 30 is simply a stage which alternates its output between a base-10 output 40 and a base-6 output 42 whenever it receives an input pulse. As discussed later, these input pulses are referred to as character pulses which are transmitted at a 10 per second rate. Each character pulse represents a four-of-ten bit-time block of counts which extend over a BCD character period. The character pulse may be generated after the fourth bit-time. At this time, a complete BCD character should have been decoded in character decoder 24. The character decoder 24 and base-select flip-flop 30 can then be considered time coordinated. They are both examining the same character position; the base-select flip-flop 30 determining which base the character is in and the character decoder 24 determining its value.

The base select flip-flop 30 takes advantage of the fact that time from seconds through minutes to hours alternates between the two base figures 10 and 6 for each succeeding character digit. As shown in the display, the seconds display is divided into units and tens, minutes are also divided into units and tens, and hours are divided into units and tens. Reading initially units for seconds (the least significant digit), it is seen that the base is set at base ten output 40; the tens for seconds is set at base six output 42; the units for minutes returns to base ten, and the tens for minutes returns to base six; the units for hours goes to base ten and so on. The transmitted signals will only go as high as 000042 (or 2400 hours) and then days are incremented. If a digit does not generate a carry (as in the case of the tens of hours which never reaches 6 but only 2 as in 2400 hours) latch circuitry 122 (see FIG. 5) in the base select flip-flop 30 causes base 10 to be set for all digits until frame sync, FS, is energized. This prevents 60 days from being read as 100 days. Days will, therefore, be counted in modulo ten up to 365. The base select flip-flop 30 reflects this 10-6-10-6-10-6 base alteration for seconds through to hours. The base select flip-flop 30 receives inputs from a frame sync, FS, and a bit counter 32. The frame sync, FS, has a special code comprising five ones followed by a zero ($111110_2$). When the zero is clocked in, the frame synchronization is established. A new number, or frame of 10 characters is read into the output register 34 to be displayed on display 36. The frame sync, FS, also resets the base select flip-flop 30 to the 10-6 modulus alteration (beginning with the base-10 corresponding to units of seconds) required when the next frame begins transmission. The bit counter 32 which provides input to the base select flip-flop 30 receives its input from the clock counter 16. As previously discussed, the clock counter 16 produces a 100 Hz count of eight signal (this signal being converted from a 1000 Hz signal to a 100 Hz 8-count signal by AND gate 12 which gated the count-of-eight count gate flip-flop 8 signal with the zero crossing detector 6 signal). The eight counts determine 1 bit-time. The clock counter 16 may be viewed then as transmitting a 100 bit-time/second signal. The 100 bit-times comprise 10 BCD character periods which make up a frame. Each BCD character period has 10 bit-times of which only the first four are counted (in the present embodiment), the last six being fillers. The 100 bit-timers/second that enter the bit counter 32 are converted into character pulses which transmit at 10 Hz into the base select flip-flop 30. The character pulse occurs after the fourth bit-time. Each entering character pulse from bit counter 32 changes the state of the flip-flop arrangement of base select flip-flop 30 as previously discussed. At the start of each frame, unless set at the end of the previous carry, the base is set at base-10 to count the units of seconds. Output 40 corresponds to a base-10 condition in base select flip-flop 30. Thus, at the beginning of each frame, AND gate 26 has one input turned ON. When the character decoder 24 contains a signal 0101 which represents BCD 10 (in inverted form), an O signal will transmit along L10 into the other input of AND gate 26 and AND gate 26 will conduct and generate a carry to carry input 44 of input-inverted AND gate 46. Similarly, when the base select flip-flop 30 is triggered to an odd-numbered digit which indicates a modulo-6 condition (such as tens of seconds, tens of minutes or tens of hours), output 42 transmits a signal to an input of AND gate 28. Now, if character decoder 24 holds the BCD number 1001, which represents six in inverted binary, a signal will impress itself on the other input to AND gate 28 and AND gate 28 will conduct and generate a carry to carry input 44 of input-inverted AND gate 46. Carry input **44*a* serves to enable (or inhibit) the serial half-adder 18 for the next character, depending on the input to the character decoder 24. If a carry is generated on carry input 44*a* the serial half-adder 18 will add one to the next BCD digit. It should be pointed out that only one base is selected at a time and thus either output 40 or output 42** is ON at any given time.

The output from shift register 22 enters input inverted AND gate 46 along with the carry signal from carry input 44. The signal of the input-inverted AND gate 46 enters output register 34 which converts the output into visual form on the display 36. It should be noted here that the output from inverted AND gate 46 into output register 34 has one of two forms. If there is a carry on carry input 44 the output is taken as 0000. (Serial half-adder 18 is reset to add one to the next incoming character digit when a carry is transmitted). If there is no carry the contents of shift register 22 are inverted (or rather re-inverted) to their original uninverted form.

Reset 50 resets peak counter 14, clock counter 16, count gate flip-flop 8, and shift register 22. Referring to FIG. 4, the output stage including output register 34 and display 36 is illustrated in detail. Although a common nixie tube display is shown, any other output form, either display or computer, could also process the output.

Figure 5:
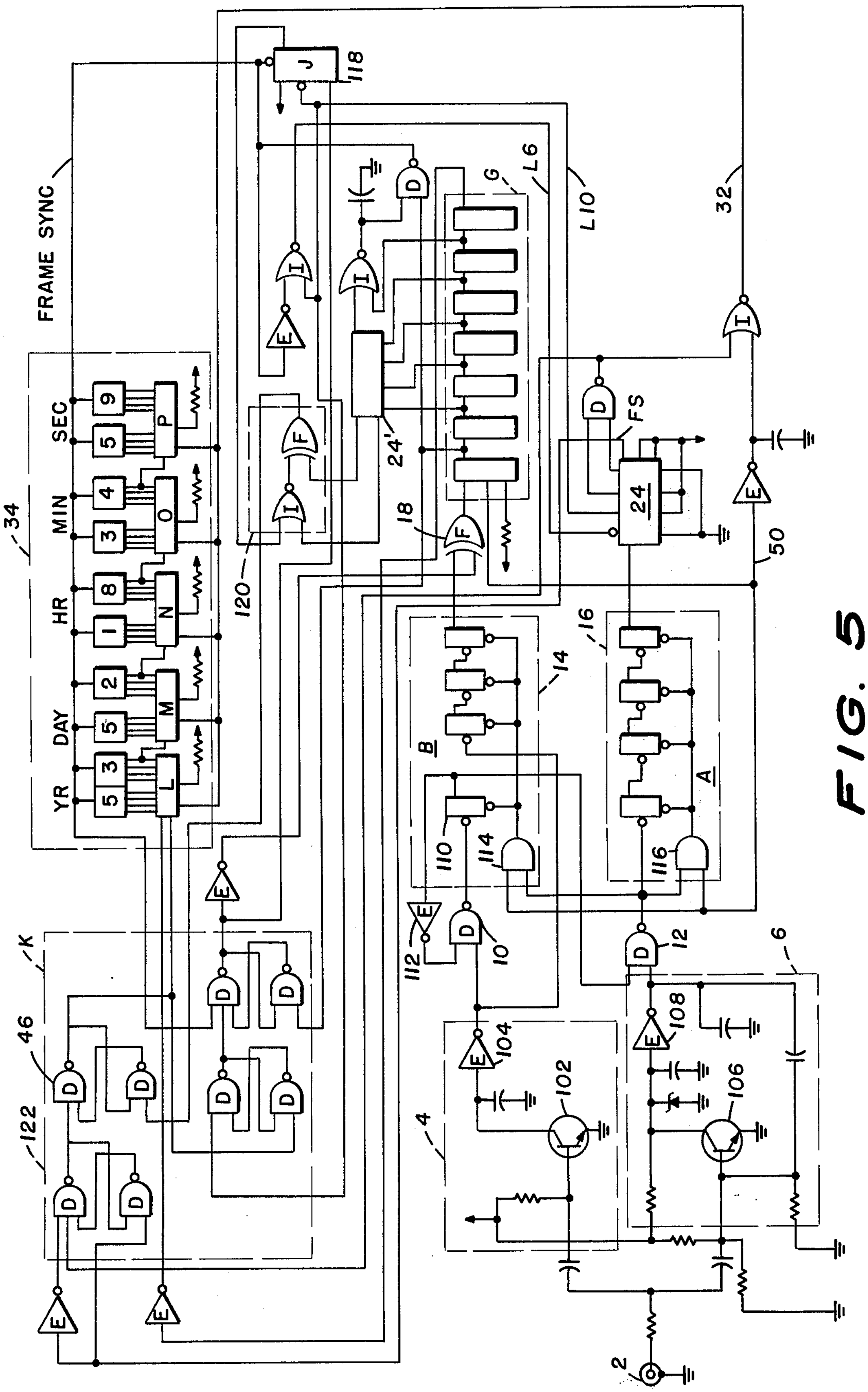
FIG. 5 is a diagram which shows the circuitry of an embodiment of the invention.

Referring now to FIG. 5, the various blocks of FIG. 1 are shown with the component parts of each clearly indicated. The NASA bit time code is one code usable with the present invention. The NASA code enters the invention at input 2 where it branches through a peak detector 4 comprising a transistor circuit 102 and an inverter 104 and through a zero crossing detector 6 comprising transistor circuit 106 and inverter 108. Count gate flip-flop 8 comprised of flip-flop 110, inverter 112, and gates 114 and 116 is located after the peak detector 4; it is shown feeding the inputs to two "ripple through" counters-peak counter 14 and clock counter 16 via AND gates 10 and 12, respectively. The output from peak counter 14 travels through serial half-adder 18 into shift register 22 which comprises an 8-bit serial shift register. The output of shift register 22 is shown entering inverted-input AND gate 46 before entering output register 34 to be displayed. Also from shift register 22 is shown the character decoder 24 which shows two output lines, L6 and L10. FS is shown emanating from character decoder 24.

Bit counter 32 is depicted as a four-of-ten counter connected to base select flip-flop 30 which comprises a triggerable J-K flip 118 and base carry decoder gates 120 via S-R latches circuitry 122.

Reset 50 is shown connected to the peak counter 14, count gate flip-flop 8, clock counter 16, and shift register 22.

FIG. 6 describes the type and function of the components found at a particular lettered location. For example, character decoder 24 at location C includes a 4-bit synchronous counter.

In the preferred embodiment the frequency of operation has been set at 1000 Hz. From the disclosure it is evident that the invention would operate efficiently at other frequencies as well. As previously discussed, because some of the input elements comprising the invention are passive, input frequencies from 125 Hz to 16 KHz are within the capabilities of the invention.

From the foregoing it can be seen that the present invention can be employed in the following modes. It can be connected directly to a time code generator and thereby produce a real-time output. This output can be recorded on an analog tape which is time coordinated with the occurrence of events the time of which is of interest. In this real-time mode, the input is at 1 KHz as described in the preferred embodiment. Another mode of operation of the present invention includes the using of the analog tape as input. Due to the capacitive nature of various input elements and the counting technique of the present invention, the analog tape may be played back at any frequency in a multi-kilohertz range (as previously discussed). If, then an event to be examined occurred at 12 o'clock, the input signal frequency can be increased to 16K by speeding up the playback (which will cause output to be produced at a faster-than-real-time rate). When the time of the event (12 o'clock) is reached, the input signal frequency can be decreased by slowing down the playback, thereby facilitating the examination of the event with respect to time. The preferred embodiment also discloses an input in NASA 36 bit code; the present invention is readily adaptable to other codes as well. Further, the preferred embodiment contemplates peak decoding limit of: less than four peaks is a binary 0 and 4 or more peaks is binary 1. This decoding limit can be any integral "*m*" which conforms to the input code. For example, making $m = 3$, one or two peaks would give a 0 bit whereas three, four, five, six, seven, or eight peaks would give a 1 bit output.

It is believed that the construction, method of design, and method of use of the present invention, as well as its advantages, are apparent from the foregoing discussion. It should be understood that, although the invention has been described with several variations, other changes may be made in the embodiments shown, without departing from the scope of the invention, as defined in the following claims.

What is claimed is:

1. A simplified time code reader which comprises:
   an input comprised of a carrier signal which carries amplitude-modulated peaks which represent coded data,
   means connected to said input for counting the number of peaks within a preset number of cycles of said input carrier signal,
   means connected to the peak counting means for serially decoding the number of peaks counted into binary 1 if the number of peaks exceed a limit number *m* and into binary 0 otherwise, means connected to the output from the peak decoding means for compensating for a selected time lag, and means for output registering a predetermined number of serially decoded binary 1's and 0's, such that the registered 1's and 0's represent the time in decoded and lag-compensated form, wherein said time code reader decodes the coded time data independent of the input carrier frequency over a multi-kilohertz range.

2. A simplified time code reader as defined in claim 1, further comprising:

a converter means operably connected to the output of the time lag compensating means for converting the predetermined number of serially decoded 1's and 0's from binary into decimal form.

3. A simplified time code reader as defined in claim 2, wherein the converter means comprises a first means to convert from binary to binary coded decimal and a second means operably connected to the first means to convert from BCD to decimal.

4. A simplified time code reader as defined in claim 1 further comprising:

a display connected to the output registering means, and a frame sync line connected to the input of the output registering means, said frame sync line delivering a pulse to the output registering means informing the output registering means to transfer its contents to the display, said pulse occurring when the predetermined number of binary 1's and 0's have been registered.

5. A simplified time code reader as defined in claim 4 further comprising a special coded signal, transmitted from the input to the frame sync, which generates a frame sync pulse.

6. A simplified time code reader as defined in claim 1, wherein the means for counting the number of peaks further comprises:

a peak detector which pulses each time a peak is sensed, means for setting the predetermined number of cycles to 10, a count gate flip-flop, connected to the peak detector, which is triggered when the peak detector generates its first pulse and which produces an output for the first eight of the 10 predetermined cycles of the carrier frequency and then stops, and an AND gate having the peak detector pulses and the count-gate flip-flop output as its inputs, said AND gate producing a signal only whenever a peak is detected during the first eight of the 10 predetermined cycles.

7. A simplified time code reader as defined in claim 1, wherein the means for registering in seriatim a predetermined number of bits, further comprises:

an inverter connected to the output from the serial half-adder, a shift register connected to the output of the inverter, a character decoder, operably connected to the shift register, for reading the inverted data in the shift register and producing modulo-6 and modulo-10 outputs when the inverted data is binary 6 or binary 10, respectively, a base select flip-flop which determines if the time code reader is counting in base-6 or base-10, an AND gate arrangement, having as its inputs the output from the character decoder and the output from the base-select flip-flop, said arrangement producing a pulse if the character decoder reads modulo-10 and the base-select flip-flop reads 10 or if the character decoder reads modulo-6 and the modulo select flip-flop reads 6, a carry output line, connected to the AND gate arrangement output, which is turned ON by an output from the AND gate arrangement, a final gate which receives inputs from the shift register and carry output line, and an output register connected to the final gate output for receiving in seriatim, from the final gate, the predetermined number of bits in decoded and lag-compensated form.

8. A simplified time code reader as defined in claim 7, further comprising:

a zero crossing detector connected to the carrier signal input, a clock counter-and-gate circuit operably connected to the zero crossing detector, and a bit counter connected to the clock counter-and-gate circuit, said zero crossing detector producing a pulse each time the carrier signal crosses zero amplitude with a positive slope, the pulses from said zero crossing detector entering the clock counter-and-gate circuit where they are changed into a bit-time/second signal, said bit-time/second signal being counted by the bit counter which reads the first 4 bit-times of each 10 bit-times and applies a character pulse indicating the presence of a character to the base select flip-flop.

9. A simplified time code reader as defined in claim 1, wherein the means for compensating for time lag comprises a serial half-adder.

10. A simplified time code reader as defined in claim 1, wherein the means for decoding the number of peaks comprises a peak counter which has $m = 4$ and the preset number of cycles is eight cycles.

11. A simplified time code reader, which comprises an input comprised of a carrier frequency signal having a normal amplitude which is pulse duration modulated to a peak amplitude whenever a D.C. pulse is carried on the carrier frequency, a peak detector connected to the first input, which produces an output pulse each time the peak amplitude is sensed, a count gate flip-flop connected to the peak detector for counting up to eight cycles of the carrier signal when it detects the first pulse from the peak detector, a first AND gate, having inputs from the peak detector output and the count gate flip-flop output, which passes a pulse only when the peak detector pulses and the count gate flip-flop is counting to 8, a peak counter which receives pulsed input from the first AND gate output, and converts it into the binary 1 where four to eight pulses are sensed and into the binary 0 where less than four pulses are sensed, a serial half-adder connected to the peak counter, incrementing the data by 1 according to standard half- adder logic, an inverter connected to the output of the serial half-adder, a shift register connected to the inverter output, a character decoder connected to the shift register, which reads the shift register data and provides output if modulo-6, modulo-10, or frame sync conditions are sensed, a zero crossing detector, connected to the first input, which produces a pulse each time the constant frequency, amplitude-modulated pulse duration modulated signal crosses the zero amplitude with a positive slope, a second AND gate connected to the zero crossing detector and count-gate flip-flop, which produces an output whenever the zero crossing detector and the count gate flip-flop are ON at the same time, a clock counter which is connected to the second AND gate output and produces a 100 bit-time/-second signal, a bit counter which receives the 100 bit-time/second signal, performs a four-of-ten count by counting only the first 4 bit-times of every 10 bit-times to determine the presence of a binary coded decimal character in the character decoder, and produces a 10 character pulse/second signal, a base select flip-flop connected to the bit counter, which receives the character pulses from the bit counter and proceeds to alternately set the base at base-10 and base-6, said base select flip-flop comprising a base-10 output and a base-6 output indicating which base the time code reader is in at any given moment, a gating arrangement, receiving as inputs the outputs from the character decoder and base-select flip-flop, which comprises a carry output which turns ON whenever either of the following conditions occur: (1) the character decoder reads a modulo-6 and the base select flip-flop is in base-6 or (2) the character decoder reads a modulo-10 and the base select flip-flop reads base-10, a final gate which is connected to the outputs of the shift register and the carry output, an output register which is connected to the final gate and which holds the output from the final gate and registers it in 10 binary coded decimal blocks representing a frame, a display connected to the output register, which converts the output register contents into decimal form to be visually displayed, and a reset device which is connected to and simultaneously resets the shift register, peak counter, clock counter, and count-gate flip-flop, wherein the time code reader has an input signal frequency of 125 Hz to 16 KHz.

12. A method of decoding and reading a pulse duration modulation coded input time signal wherein the input signal is comprised of a carrier which is amplitude modulated by a pulse duration signal which creates high amplitude peaks for the length of the pulse duration, comprising the steps of:

receiving the peak inputs serially from a time code source, counting the number of peaks within a preset number of cycles of said input signal, decoding the number of peaks per preset number of cycles into a 1 or 0 bit, collecting a predetermined number of serially received bits, such that the collected 1's and 0's represent a frame of actual time in decoded form, and compensating for a time lag representing the time between receiving said input signal and collecting the received bits.

13. A method of decoding and reading a pulse duration modulation coded time signal as defined in claim 12, comprising the further step of:

changing the frequency of said input signal to another frequency within a multi-kilohertz range.

14. A method of decoding and reading a pulse duration modulation coded time signal as defined in claim 13, comprising the further step of:

converting the collected predetermined number of serially received binary 1's and 0's into decimal form.

15. A method of decoding and reading a pulse duration modulation coded time signal as defined in claim 13, comprising the further step of:

resetting the time code reader before each frame begins.

16. A method of decoding and reading a pulse duration modulation coded input time signal, wherein the input signal is comprised of an amplitude-modulated carrier, comprising the steps of:

receiving time-coded peak inputs serially from a time code generator, detecting the presence of a peak, counting the number of detected peaks in the first eight of each ten cycles of the input time signal, converting the number of counted peaks into binary 1 where four to eight peaks are counted and into binary 0 where less than four peaks are counted, serially half adding one to the converted binary data to compensate for a time lag in the time code reader, inverting the serially-half added output, collecting the inverted output into binary coded decimal characters of four serially collected binary numbers per binary coded decimal characters, placing the character blocks into a shift register, decoding the character placed in the shift register into modulo numbers corresponding to the decimals 1 through 10, providing outputs for modulo-6 where the decoded character represents the decimal number 6 and for modulo-10 where the decoded character represents the decimal number 10, dividing the input signal into character pulses, feeding the character pulses into a base-select flip-flop, alternating the base by which the flip-flop counts between base-6 and base-10 with each received character pulse until no carry is generated latching the circuit to remain in base-10 when a digit does not generate a carry, gating the modulo-6 and modulo-10 outputs from the character decoder with the base-6 and base-10 outputs, respectively from the base-select flip-flop, feeding output from the gates onto a carry output line, feeding the carry output and shift register output into an inverted-input AND gate, delivering the inverted-input AND gate output into an output register, converting the output into decimal form BCD, displaying the final output in decimal form, and resetting the counters and shift register for the next frame, and frame synchronizing the base-select flip-flop and output register when a $111110_2$ signal is read during character decoding.

* * * * *